(12) United States Patent
Umeda et al.

(10) Patent No.: US 8,334,532 B2
(45) Date of Patent: Dec. 18, 2012

(54) IGZO-BASED OXIDE MATERIAL AND METHOD OF PRODUCING IGZO-BASED OXIDE MATERIAL

(75) Inventors: Kenichi Umeda, Kanagawa (JP); Masayuki Suzuki, Kanagawa (JP); Atsushi Tanaka, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 316 days.

(21) Appl. No.: 12/815,414

(22) Filed: Jun. 15, 2010

(65) Prior Publication Data
US 2010/0320458 A1    Dec. 23, 2010

(30) Foreign Application Priority Data
Jun. 22, 2009  (JP) .................................. 2009-147931

(51) Int. Cl.
*H01L 29/12* (2006.01)
*H01L 21/26* (2006.01)
*H01L 21/324* (2006.01)
*H01L 21/42* (2006.01)
*H01L 21/477* (2006.01)

(52) U.S. Cl. .................. 257/43; 438/796; 257/E29.079; 257/E21.328

(58) Field of Classification Search .................. 438/796; 257/43, E29.079, E21.328
See application file for complete search history.

(56) References Cited

FOREIGN PATENT DOCUMENTS
JP           3947575 B       7/2007
JP      2007-223886 A       9/2007

OTHER PUBLICATIONS

Nature, 432 (2004) pp. 488-492.
Journal of the American Ceramic Society, 82 (1999) pp. 2705-2710.

*Primary Examiner* — David S Blum
(74) *Attorney, Agent, or Firm* — SOLARIS Intellectual Property Group, PLLC

(57) ABSTRACT

The invention provides an IGZO-based oxide material and a method of producing the same, the IGZO-based oxide material being represented by a composition formula of $In_{2-x}Ga_xZnO_{4-\delta}$, where $0.75<x<1.10$ and $0<\delta\leq 1.29161\times\exp(-x/0.11802)+0.00153$, and being formed from a single phase of IGZO having a crystal structure of $YbFe_2O_4$.

9 Claims, 14 Drawing Sheets

IGZO-BASED OXIDE MATERIAL AND METHOD OF PRODUCING IGZO-BASED OXIDE MATERIAL

CROSS-REFERENCE TO RELATED APPLICATION

This application claims priority under 35 USC 119 from Japanese Patent Application No. 2009-147931, filed on Jun. 22, 2009, the disclosure of which is incorporated by reference herein.

BACKGROUND OF THE INVENTION

1. Field of the Invention

The invention relates to an IGZO-based oxide material and a method of producing an IGZO-based oxide material.

2. Description of the Related Art

In recent years, amorphous In—Ga—Zn—O-based homologous oxide materials (hereinafter, referred to as "IGZO-based oxide materials" or simply as "IGZO" sometimes), represented by a composition formula $In_{2-x}Ga_xO_3(ZnO)_m$, ($0<x<2$ and m is a natural number) in a crystalline state thereof, have been attracting attention.

Hosono et al. from Tokyo Institute of Technology reports that the amorphous IGZO-based oxide materials exhibit a value of electrical resistivity similar to that of a semiconductor and can be formed into a film at room temperature, and that these materials can achieve a mobility that is equal to or higher than that of amorphous silicon (Hosono et al., Non-patent Document 1, Nature, 432 (2004) pp. 488-492).

In particular, amorphous IGZO-based oxide materials represented by the above composition formula in which m=1 are highly promising material systems because of their great amount of ratio of overlapping of electron orbits between In—In which is considered to contribute to the conduction of electrons.

Research and development on the amorphous IGZO-based oxide materials are being intensely conducted with respect to the use of these materials as, for example, an effective material for an active layer of a thin film transistor (hereinafter, referred to as "TFT" sometimes).

On the other hand, IGZO-based oxide materials having a crystalline structure are described, for example, in the following literatures.

Non-patent Document 2 (Journal of the American Ceramic Society, 82 (1999) pp. 2705-2710) describes a method of producing a crystalline IGZO-based oxide material in which m=1, in which a mixture of raw materials including In, Ga and Zn is annealed at 1350° C. or higher, and then rapidly cooled down from this extremely high annealing temperature. The document also discloses that the solid solution range of Ga (range of x) is from 0.66 to 1.06.

Further, Japanese Patent No. 3947575 discloses a process of subjecting a crystalline IGZO-based oxide material in which m=1, which is obtained by annealing at certain conditions, to a reduction heat treatment at a certain temperature in a hydrogen or argon atmosphere.

In this regard, in many of electron-conductive oxide materials properties including IGZO, properties that are unique to these materials are significantly affected by the value of an amount of oxygen vacancy $\delta$. When the value of $\delta$ is great, a large number of carriers (electrons) are generated and a "degenerate semiconductor", having a Fermi level within the conductive band, is formed. In other words, the oxide material in this state is a conductor that exhibits metallic conductivity. On the other hand, when the value of $\delta$ is small, generation of carriers can be suppressed and the oxide material can exist as a semiconductor. The above fact indicates that the nature of an oxide material may greatly vary from a conductor to a semiconductor, depending on the value of oxide deficit amount $\delta$.

SUMMARY OF THE INVENTION

The present invention has been made in view of the above circumstances and provides an IGZO-based oxide material and a method of producing an IGZO-based oxide material.

A first aspect of the invention provides an IGZO-based oxide material represented by a composition formula of $In_{2-x}Ga_xZnO_{4-\delta}$, where $0.75<x<1.10$ and $0 <\delta \leq 1.29161 \times \exp(-x/0.11802)+0.00153$, and formed from a single phase of IGZO having a crystal structure of $YbFe_2O_4$.

A second aspect of the present invention provides a method of producing the IGZO-based oxide material according to the first aspect of the present invention, the method comprising annealing, in an oxygen-containing atmosphere, a mixed material including In, Ga and Zn, under conditions of a maximum annealing temperature of from 1200° C. to 1400° C. and an average rate of temperature decrease from the maximum annealing temperature to 300° C. of from 50° C./hr to 500° C./hr.

A third aspect of the present invention provides a method of producing the IGZO-based oxide material according to the first aspect of the present invention, the method comprising:

producing an IGZO-based oxide represented by a composition formula of $In_{2-x}Ga_xZnO_{4-\delta}$, where $0.75<x<1.10$ and $\delta>0$, and formed from a single phase of IGZO having a crystal structure of $YbFe_2O_4$; and controlling the range of $\delta$ in the composition formula of the IGZO-based oxide to $0<\delta \leq 1.29161 \times \exp(-x/0.11802)+0.00153$ by subjecting the IGZO-based oxide to post-annealing in an oxidizing atmosphere that contains oxygen.

BRIEF DESCRIPTION OF THE DRAWINGS

Exemplary embodiments of the present invention will be described in detail based on the following figures, wherein.

DETAILED DESCRIPTION OF THE INVENTION

Figure 1:
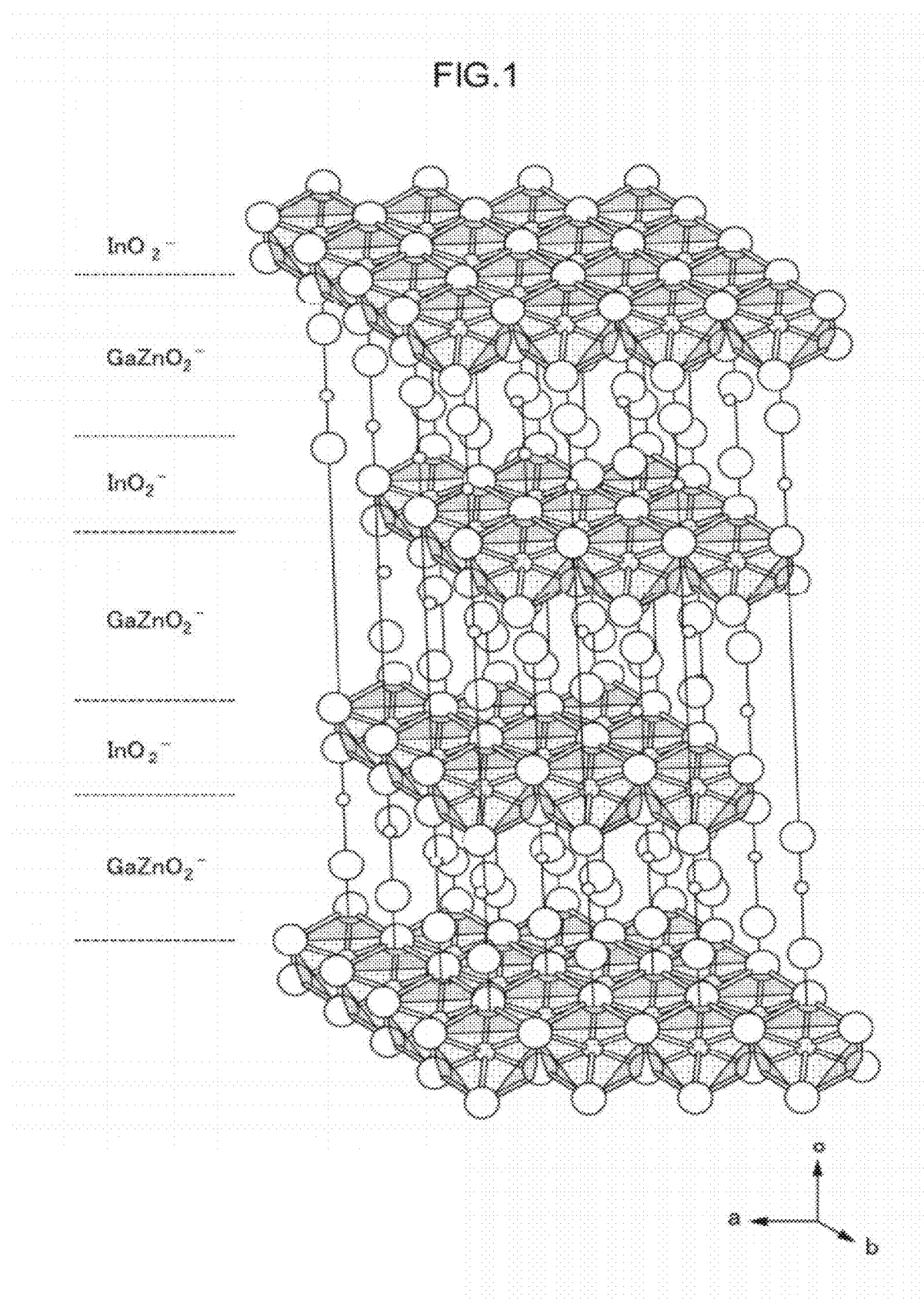
FIG. 1 shows the crystal structure of an IGZO-based oxide material according to a first exemplary embodiment of the invention.

In the following, an exemplary embodiment of the IGZO-based oxide material and the method of producing the IGZO-based oxide material is described with reference to the drawings. In the drawings, components having the substantially same function as that of the components that have been previously explained are shown with the same symbol, and explanation thereof may be omitted sometimes.

(Details of IGZO-Based Oxide Material)

First, details of the IGZO-based oxide material are described.

The IGZO-based oxide material according to the first exemplary embodiment of the invention has a crystal IGZO phase represented by a composition formula of $In_{2-x}Ga_xO_3(ZnO)_m$ in which m=1. Specifically, in consideration of oxygen vacancy, the material is formed from an IGZO phase represented by a composition formula of $In_{2-x}Ga_xZnO_{4-\delta}$.

FIG. 1 shows a crystal structure of the IGZO-based oxide material according to the first exemplary embodiment.

The IGZO phase that forms the IGZO-based oxide material may be single-crystalline or polycrystalline, and has a crystal structure of $YbFe_2O_4$ as shown in FIG. 1. The crystal structure shown in FIG. 1 is drawn by using a software (trade name: VESTA) based on a JCPDS card of $InGaO_3(ZnO)$ (No. 38-1104).

Further, the IGZO-based oxide material is formed from a single phase of IGZO, as mentioned above. In the present specification, the term "single phase" refers to the case in which all peaks are derived from the IGZO phase when the peaks are confirmed from the result of measurement carried out by using a powder X-ray diffraction measurement device (RINT-ULTIMA III, trade name, manufactured by Rigaku Corporation), and no peak derived from impurities is observed. Accordingly, even if an IGZO-based oxide material contains a small amount of impurities that cannot be determined by powder X-ray diffraction measurement, this material may be considered to be formed from a single phase of IGZO.

As shown above, when an IGZO-based oxide material is formed from a single phase of IGZO, occurrence of electron scattering at grain boundaries or the like can be suppressed, and the mobility of carriers (electrons) can be maintained, as compared with the case in which multiple crystalline phases exist in combination. Therefore, this material can be effectively applied to an active layer of a TFT or the like.

The value of resistivity of an IGZO-based oxide material is in the range of from $1\times10^2$ Ω·cm to $1\times10^9$ Ω·cm when measured by a resistivity measurement device (AC Hall measurement device, RESITEST 8300, trade name, manufactured by Toyo Corporation), which falls within a range of the value of resistivity that is typically suitable for an active layer of a TFT, and this range indicates that the material is a semiconductor.

When an IGZO-based oxide material is used for an active layer of a TFT, the value of resistivity thereof is preferably in the range of from $1\times10^4$ Ω·cm to $1\times10^5$ Ω·cm, since the Vgs-Id curve rises at around 0 V.

In the composition formula $In_{2-x}Ga_xZnO_{4-\delta}$, the range of x is 0.75<x<1.10, preferably 0.80≦x≦1.05 and more preferably 0.80≦x≦1.00 in view of reliability. This range of x represents the solid-solution range of Ga. When the amount of Ga in an IGZO-based oxide material is outside this solid-solution range, the IGZO-based oxide material is not formed only from an IGZO phase (single phase), but is in a mixed state of an IGZO phase with an impurity phase of $In_2O_3$, $ZnGa_2O_4$ or the like.

In the composition formula $In_{2-x}Ga_xZnO_{4-\delta}$, the range of an amount of oxygen vacancy δ is 0<δ≦1.29161×exp(−x/0.11802)+0.00153, preferably 0.0002≦δ≦1.29161×exp(−x/0.11802)+0.00153. The term "exp" refers to an exponential function where the base is e.

However, it is generally difficult to precisely determine the absolute value or the range of an amount of oxygen vacancy of an oxide such as IGZO, since a high degree of measurement accuracy is required and it is not easy to differentiate from moisture, impurities or the like. Therefore, δ may be satisfied with a value at which the value of resistivity of an IGZO-based oxide material is within a range of from $1\times10^2$ Ω·cm to $1\times10^9$ Ω·cm.

The upper limit of an amount of oxygen vacancy δ (δ max) is the value of an amount of oxygen vacancy at which the value of resistivity of $In_{2-x}Ga_xZnO_{4-\delta}$ is $1\times10^2$ Ω·cm or higher, which is calculated from the result of thermogravimetric analysis and the results of measuring the resistivity and the Hall measurement. Details of the calculation method are described later.

The reason why the lower limit of an amount of oxygen vacancy δ is higher than 0 is that when δ=0, the IGZO-based oxide material is presumed to be an insulator since carriers (electrons) are not generated.

In this regard, for example, Japanese Patent No. 3644647 describes that conductivity can be imparted to an IGZO-based oxide material by performing element substitution, even if the amount of oxygen vacancy is zero. It is true that a dope effect can be achieved by element substitution, but in most cases carriers are generated by substituting an element with another element having a different valency, and in principle, carriers are not generated by substituting an element with another element having the same valency. If it is desired to effectively conduct electron doping while the amount of oxygen vacancy being zero, the doping is conducted by substituting an element with another element having a different valency, for example, substituting a trivalent site of In or Ga with a tetravalent element or substituting a divalent site of Zn with a trivalent element.

(Method of Producing IGZO-Based Oxide Material)

In the following, the method of producing the IGZO-based oxide material is described.

Exemplary methods of producing the IGZO-based oxide material according to the first exemplary embodiment of the invention include a method of producing powder, such as a solid-phase reaction method, a sol-gel method, an oxalate method, an alkoxide method or a coprecipitation method; a method of producing a single crystal, such as a flux method, a zone melting method, a CZ method or a glass annealing method via a glass precursor; and a method of producing a thin film, such as a sputtering method, a laser abrasion method, a chemical vapor deposition (CVD) method or a metal organic decomposition (MOD) method. In the following, details of the solid-phase reaction method are described.

1. Preparation of Raw Materials

First, a compound including In, a compound including Ga and a compound including Zn are prepared as the raw materials for the IGZO-based oxide material according to the first exemplary embodiment of the invention.

Examples of the compound including In include $In_2O_3$, $In(NO_3)_3$, $In(NO_3)_3 \cdot nH_2O$, $In(CH_3COO)_3$, $In(CH_3COO)_2(OH)$, $In_2O_3 \cdot nH_2O$, InN, $In(OH)_3$, InO(OH), $In_2(C_2O_4)_3$, $In_2(C_2O_4)_3 \cdot 4H_2O$, $In(C_2H_5OCS_2)_3$ and $In_2(SO_4)_3 \cdot nH_2O$.

Examples of the compound including Ga include, similarly to the compound including In, $Ga_2O_3$, $Ga(NO_3)_3$, $Ga(NO_3)_3 \cdot nH_2O$, $Ga(CH_3COO)_3$, $Ga(CH_3COO)_2(OH)$, $Ga_2O_3 \cdot nH_2O$, GaN, $Ga(OH)_3$, GaO(OH), $Ga_2(C_2O_4)_3$, $Ga_2(C_2O_4)_3 \cdot 4H_2O$, $Ga(C_2H_5OCS_2)_3$ and $Ga_2(SO_4)_3 \cdot nH_2O$.

Examples of the compound including Zn include ZnO, $Zn(C_2H_3O_2)_2$, $Zn(C_2H_3O_2)_2 \cdot 2H_2O$, $ZnBr_2$, $ZnCO_3$, ZnS, $ZnCl_2$, $ZnF_2$, $ZnF_2 \cdot 4H_2O$, $Zn(OH)_2$, $ZnI_2$, $Zn(NO_3)_2 \cdot 6H_2O$, $ZnC_2O_4$, $Zn(CN)_2$, $Zn(OCH_3)_2$, $Zn(OC_2H_5)_2$ and $ZnSO_4$.

2. Measurement and Mixing of Raw Materials

The raw materials as prepared above are measured using an electronic balance so that the finally obtained IGZO-based oxide material has a desired composition ratio of the raw materials. Then, the raw materials are uniformly mixed using a ceramic pot mill, or a mortar and a pestle, thereby obtaining a mixed material including In, Ga and Zn.

3. Drying and Shaping of Mixed Material

The mixed material including In, Ga and Zn is appropriately dried, and shaped. These processes of drying and shaping can be skipped.

4. Pre-Annealing and Main-Annealing of Mixed Material

Subsequently, the mixed material including In, Ga and Zn is subjected to pre-annealing. The pre-annealing is conducted in order to promote the reaction by maintaining the activity of particles in the unreacted phase by treating the mixed material at a temperature immediately under the temperature at which the desired crystal phase is obtained as a single phase. Another reason of conducing the pre-annealing is to remove carbon that is included in the mixed material in a small amount. The pre-annealing may be conducted, for example, at a maximum annealing temperature (Tmax) of from 400° C. to 1200° C., a time for maintaining Tmax of from 1 hour to 24 hours, an average rate of temperature increase of from 100° C. to 1000° C./hr (hr represents hour), and an average rate of temperature decrease of from 50° C./hr to 1000° C./hr. However, the conditions for the pre-annealing are not particularly limited thereto.

Thereafter, the mixed material that has been subjected to pre-annealing is preferably subjected to main-annealing under the conditions that include all of the following (A) to (D).

(A) The annealing atmosphere for the main-annealing is an atmosphere containing oxygen in order to allow the sintered body to absorb oxygen, during the step of temperature decrease. The oxygen concentration in the atmosphere is preferably 10% or higher in view of starting the intake of oxygen, and the oxygen concentration is more preferably equal to or higher than that of the air (approximately 21% or higher) in view of further promoting the intake of oxygen.

(B) The time for maintaining the maximum annealing temperature Tmax (details thereof are described later) is, for example, from 0.5 hours to 24 hours in view of sufficiently causing the solid-phase reaction of the raw materials, improving productivity, or the like.

(C) The average rate of temperature decrease from Tmax to 300° C. is from 50° C./hr to 500° C./hr. This rate is typically referred to as "slowly-cooling".

The reason why the average rate of temperature decrease is 50° C./hr or higher is to suppress the reduction of an amount of oxygen vacancy δ down to 0 in the sintered body $In_{2-x}Ga_xZnO_{4-\delta}$ obtained after the main-annealing, as a result of excessive absorption of oxygen during the temperature decrease, thereby suppressing the formation of an insulator from the sintered body.

The reason why the average rate of temperature decrease is 500° C./hr or lower is to suppress the increase of an amount of oxygen vacancy δ in the sintered body $In_{2-x}Ga_xZnO_{4-\delta}$ obtained after the main-annealing, as a result of excessively suppressing the absorption of oxygen during the temperature decrease at a rate of higher than 500° C./hr that is typically referred to as "quenching", thereby maintaining the sintered body to be a semiconductor.

In order to control the value of δ to be within a more suitable range, the average rate of temperature decrease is preferably from 100° C./hr to 200° C./hr.

The reason why the lower limit of temperature decrease is 300° C. is to prevent the amount of oxygen vacancy δ from being significantly changed.

In this regard, the amount of oxygen vacancy δ may change depending on the conditions of annealing atmosphere even if the lower limit of temperature decrease is lower than 300° C., such as 100° C. Therefore, the lower limit of temperature decrease is preferably 100° C., more preferably room temperature (25° C.).

(D) The maximum annealing temperature Tmax is not particularly limited as long as the sintered body obtained after the main-annealing forms a single phase of IGZO, and may change depending on the type or the particle size of the raw materials. For example, when $In_2O_3$, $Ga_2O_3$ and ZnO are used as the starting materials, the maximum annealing temperature Tmax is in the range of from 1200° C. to 1400° C., more preferably from 1350° C. to 1400° C.

The range of the maximum annealing temperature Tmax as mentioned in (D) is based on the following experimental results.

An IGZO-based oxide represented by $In_{2-x}Ga_xZnO_{4-\delta}$ in which x=1, i.e., $InGaZnO_{4-\delta}$, was prepared by mixing oxide powders of $In_2O_3$, $Ga_2O_3$ and ZnO at a desired molar ratio, shaping the mixed material, and annealing the same. The annealing was conducted in the air under the conditions in which the temperature was increased at a rate of 500° C./hr to a desired temperature (1000° C., 1100° C., 1200° C., 1300° C., 1350° C., 1400° C. or 1450° C.), which was maintained for 2 hours, and then the temperature was slowly decreased to room temperature.

The samples annealed at respective annealing temperatures as described above were subjected to powder X-ray diffraction measurement using a powder X-ray diffraction measurement device (RINT-ULTIMA III, trade name, manufactured by Rigaku Corporation). The results of the measurement are shown in FIG. 2 and Table 1.

TABLE 1

| Maximum Annealing Temperature Tmax | Precipitated Crystal Phase | JCPDS-No |
|---|---|---|
| Tmax ≧ 1450° C. | $InGaZnO_4$ | 38-1104 |
|  | $InGa_2O_4$ | 38-1240 |
|  | $In_2Ga_2ZnO_7$ | 38-1097 |
| 1200° C. ≦ Tmax ≦ 1400° C. | $InGaZnO_4$ | 38-1104 |
| 1100° C. ≦ Tmax < 1200° C. | $InGaZnO_4$ | 38-1104 |
|  | $In_2O_3$ | 06-0416 |
|  | $ZnGa_2O_4$ | 38-1240 |
|  | $InGaZn_2O_5$ | 40-0252 |
| Tmax ≦ 1000° C. | $In_2O_3$ | 06-0416 |
|  | $ZnGa_2O_4$ | 38-1240 |
|  | $InGaZn_2O_5$ | 40-0252 |

Figure 2:
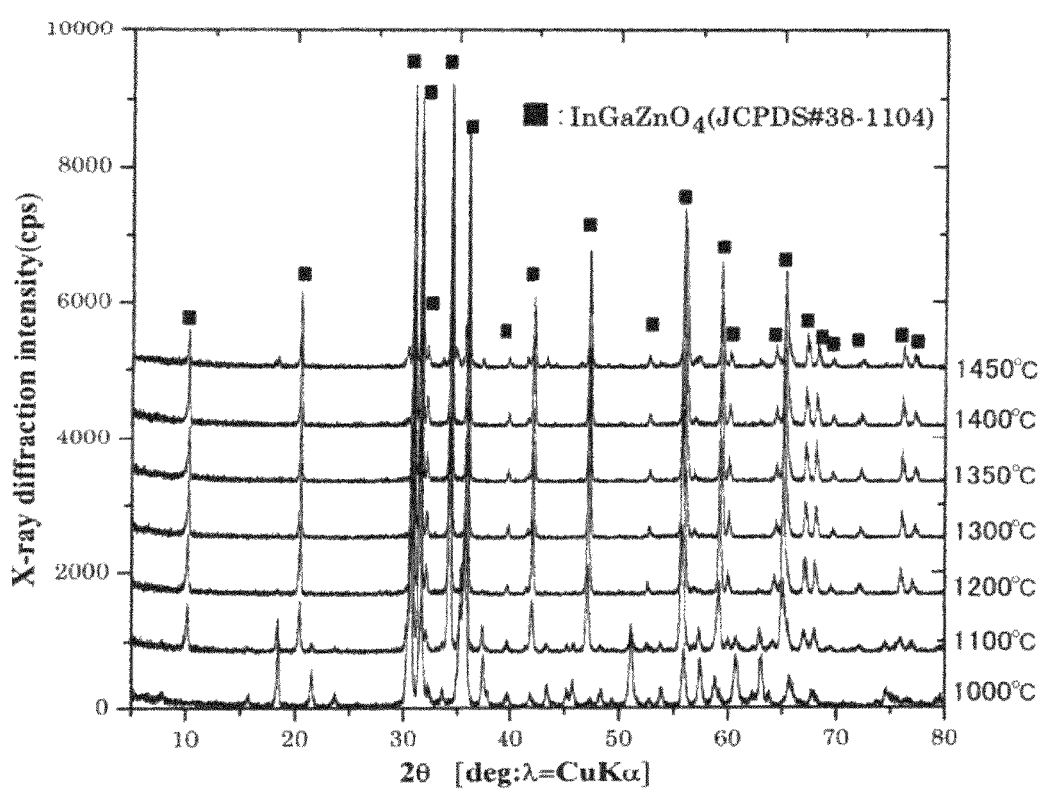
FIG. 2 shows the X-ray diffraction patterns of the samples obtained at different maximum annealing temperatures.

From the results as shown in FIG. 2 and Table 1, it was confirmed that the reaction did not sufficiently proceed at 1000° C. or lower and an IGZO phase was not obtained, while an IGZO phase was precipitated at 1100° C. or higher. It was also confirmed that an IGZO phase existed as a single phase when the annealing was conducted at 1200° C. Moreover, it was confirmed that the IGZO phase started to decompose when the annealing was conducted at an even higher temperature of 1450° C. or higher.

In view of the above results, in order to obtain a single phase of IGZO in a solid-phase reaction method in which the temperature decrease is carried out in a manner of "slowly cooling" as described in (C), the maximum annealing temperature Tmax during the main-annealing is preferably within the range of from 1200° C. to 1400° C., as mentioned above. This is because precipitation of impurities can be suppressed when the annealing is conducted at a maximum annealing temperature Tmax within this range.

Figure 3:
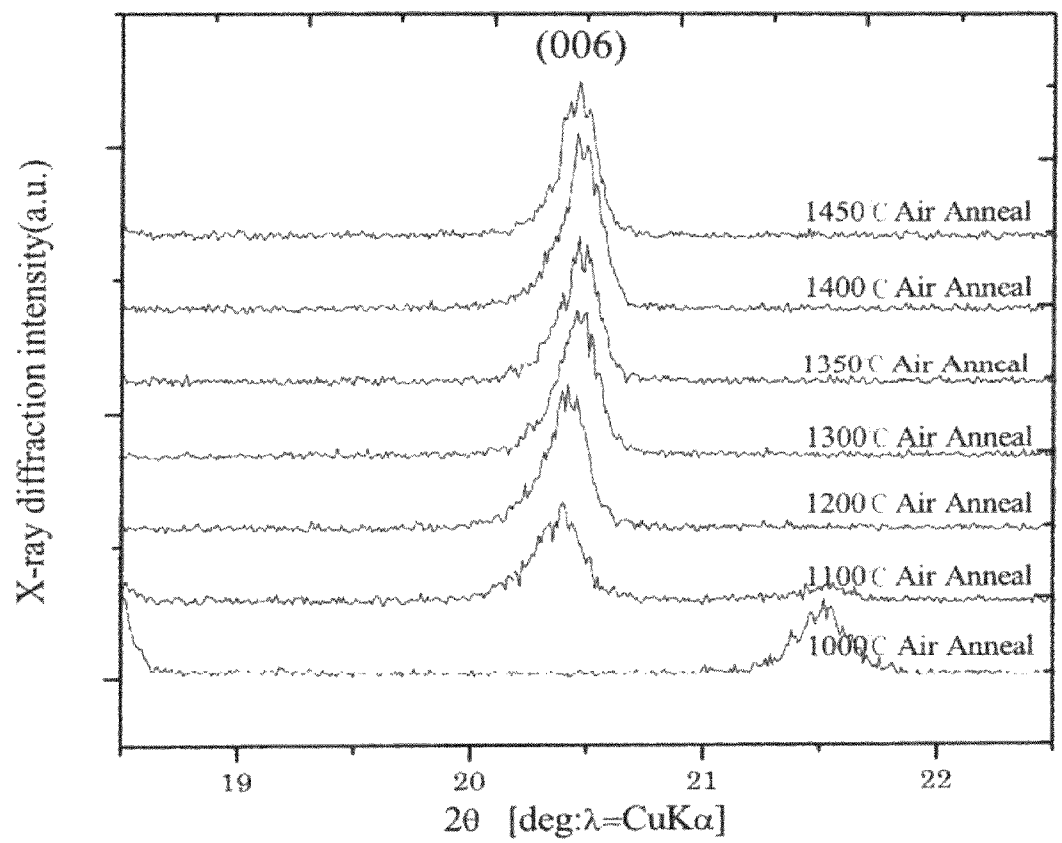
FIG. 3 shows an enlarged view of the X-ray diffraction patterns described in FIG. 2.
Figure 4:
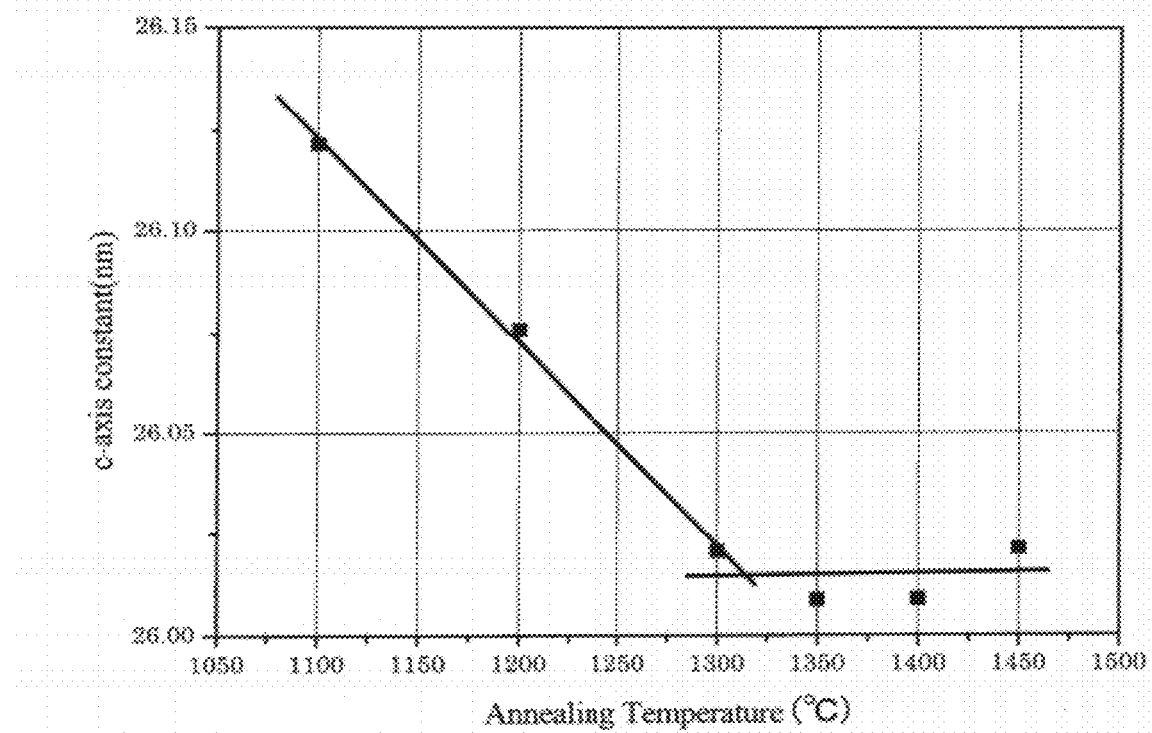
FIG. 4 shows the c-axis lattice constants of the samples obtained at different maximum annealing temperatures.

Further, it was proved that the c-axis lattice constant calculated from the peak (006) in the X-ray diffraction pattern of the IGZO single phase region at from 1200° C. to 1400° C. was decreased as the annealing temperature was increased up to 1350° C., while the c-axis lattice constant was constant at 1350° C. or higher (see FIGS. 3 and 4). This shows that the crystal of IGZO phase exists in a stable manner at 1350° C. or higher.

As a result, it was proved that the Tmax in the main-annealing was more preferably from 1350° C. to 1400° C. when the temperature was decreased in a manner of "slowly cooling" as described in (C) in a solid-phase reaction method.

By subjecting the pre-annealed material to main-annealing under the conditions that satisfy all of the aforementioned (A) to (D), the IGZO-based oxide material according to the first exemplary embodiment of the invention can be produced.

<Variations>

In the above sections, the exemplary embodiments of the invention are explained. However, the invention is not limited to these exemplary embodiments.

For example, the maximum annealing temperature Tmax, which is one of the conditions for conducting the main-annealing, is not particularly limited to the range of from 1200° C. to 1400° C. if the synthesis is conducted by a method other than the solid-phase reaction method as described in the first exemplary embodiment. For example, when a low-temperature synthesis method such as a sol-gel method or a coprecipitation method is employed, the range of maximum annealing temperature Tmax may be set to a lower level than that required in the solid-phase reaction method.

Further, the IGZO-based oxide material according to the first and second exemplary embodiments of the invention is produced by employing a technique of "slowly cooling" in a cooling step during the main-annealing. However, this technique of "slowly cooling" may not be employed in the cooling step during heating if the value of δ in the composition formula of IGZO-based oxide material ($In_{2-x}Ga_xZnO_{4-\delta}$), which is obtained by heating the same at certain conditions, is controlled to $0<\delta<1.29161 \times \exp(-x/0.11802)+0.00153$, by further subjecting the IGZO-based oxide material to post-annealing under an oxygen-containing atmosphere.

This technique of post-annealing is particularly effective when, for example, the IGZO-based oxide material with the amount of oxygen vacancy δ of not less than $1.29161 \times \exp(-x/0.11802)+0.00153$ is a conductor, in order to change the IGZO-based oxide material to a semiconductor by controlling the value of δ to the range of $0<\delta<1.29161 \times \exp(-x/0.11802)+0.00153$. Moreover, this technique is effective also in the case in which the IGZO-based oxide material is a semiconductor with δ in the range of $0<\delta<1.29161 \times \exp(-x/0.11802)+0.00153$, in order to change the value of resistivity of the IGZO-based oxide material to a desired value by changing the value of δ to a different value within the range of $0<\delta<1.29161 \times \exp(-x/0.11802)+0.00153$.

EXAMPLES

In the following, the IGZO-based oxide material and a method of producing an IGZO-based oxide material according to the invention are described with reference to the examples. However, the invention is not limited to these examples.

Example 1

1. Preparation of Raw Materials

As the raw materials for the IGZO-based oxide material according to Example 1 of the invention, an oxide powder of $In_2O_3$ (manufactured by Kojundo Chemical Lab. Co., Ltd., purity: 99.99%), an oxide powder of $Ga_2O_3$ (manufactured by Kojundo Chemical Lab. Co., Ltd., purity: 99.99%), and an oxide powder of ZnO (manufactured by Kojundo Chemical Lab. Co., Ltd., purity: 99.99%) were prepared.

2. Measurement and Mixing of Raw Material Powders

These oxide powders were measured using an electronic balance such that the molar ratio of In:Ga:Zn is 2−x:x:1 ($0.5 \leq x \leq 1.2$). For example, when the molar ratio of In:Ga:Zn is 1:1:1 (x=1), the mass of $In_2O_3$ is 30.0000 g, the mass of $Ga_2O_3$ is 20.2430 g, and the mass of ZnO is 17.5758 g.

These oxide powders were placed in a polyethylene wide-month bottle together with 100 ml of ethyl alcohol and 150 alumina balls having a diameter of 10 mm. This wide-mouth bottle is sealed so that the liquid was not spilled out, and the oxide powders were uniformly mixed by a wet method by rotating the wide-mouth bottle at 120 to 130 rpm for 12 hours using a desk-top pot mill rotating table.

3. Drying and Shaping of Powder Mixture

The alumina balls were taken out from the slurry of powder mixture obtained by mixing the same by a wet-method, and ethyl alcohol was removed therefrom using a rotary evaporator. The obtained powder mixture was dried at 100° C. for 12 hours and roughly crumbled in a mortar, and was then shaped into pellets having a square shape of 6 mm$^2$ and a thickness of 2 mm, by a uniaxial shaping method at a shaping pressure of 100 MPa.

4. Pre-Annealing and Main-Annealing of Powder Mixture

A Pt sheet was placed in an alumina sagger (SSA-S, trade name, manufactured by Nikkato Corporation), and the shaped product obtained by a uniaxial shaping method was placed on the Pt sheet. The alumina sagger on which the shaped product was placed was placed in a high-temperature furnace (FD41) and the shaped product was subjected to pre-annealing under an atmosphere by increasing the temperature at a rate of 500° C./hr, maintaining the maximum annealing temperature at 1100° C. for 2 hours, and then slowly cooling at a rate of 100° C./hr. After the pre-annealing, the pre-annealed body was pulverized in an agate mortar, and the obtained powder was again shaped into pellets by a uniaxial shaping method at a shaping pressure of 100 MPa.

Subsequently, the pre-sintered body shaped in the form of pellets was subjected to main-annealing at a maximum annealing temperature Tmax of about 1350° C. Other conditions for the main-annealing were the same as that of the pre-annealing.

The aforementioned processes (1. preparation of raw materials, 2. measurement and mixing of raw material powders, 3. drying and shaping of powder mixture and 4. pre-annealing and main-annealing) were repeated while changing the input molar ratio x of Ga in the raw materials, as shown in the following Table 2. In Table 2, sample numbers are given to the samples as prepared when the value of input molar ratio x of Ga in the raw material is given as a predetermined value.

TABLE 2

| | Molar Ratio x when In:Ga:Zn = 2 − x:x:1 |
|---|---|
| Sample 1 | 0.50 |
| Sample 2 | 0.60 |
| Sample 3 | 0.70 |
| Sample 4 | 0.75 |
| Sample 5 | 0.80 |
| Sample 6 | 0.85 |
| Sample 7 | 0.90 |
| Sample 8 | 0.95 |
| Sample 9 | 1.00 |
| Sample 10 | 1.05 |
| Sample 11 | 1.10 |
| Sample 12 | 1.20 |
| Sample 13 | 1.30 |
| Sample 14 | 1.40 |
| Sample 15 | 1.50 |

5. X-Ray Diffraction Measurement

The pellets of samples 1 to 15 obtained by performing the main-annealing were pulverized in an agate mortar, respectively, and X-ray diffraction measurement of these samples was carried out using an X-ray diffraction measurement device (RINT-ULTIMA III, trade name, manufactured by Rigaku Corporation).

Specifically, the measurement was conducted with the above device using CuKα rays, at a tube voltage of 40 kV, a tube current of 40 mA, a scanning speed of 2.0 deg/min, a light-receiving slit of 0.15 mm, and a scanning range of from 2θ: 5° to 135°. X-ray diffraction patterns of samples 1 to 15 were thus obtained.

Figure 5:
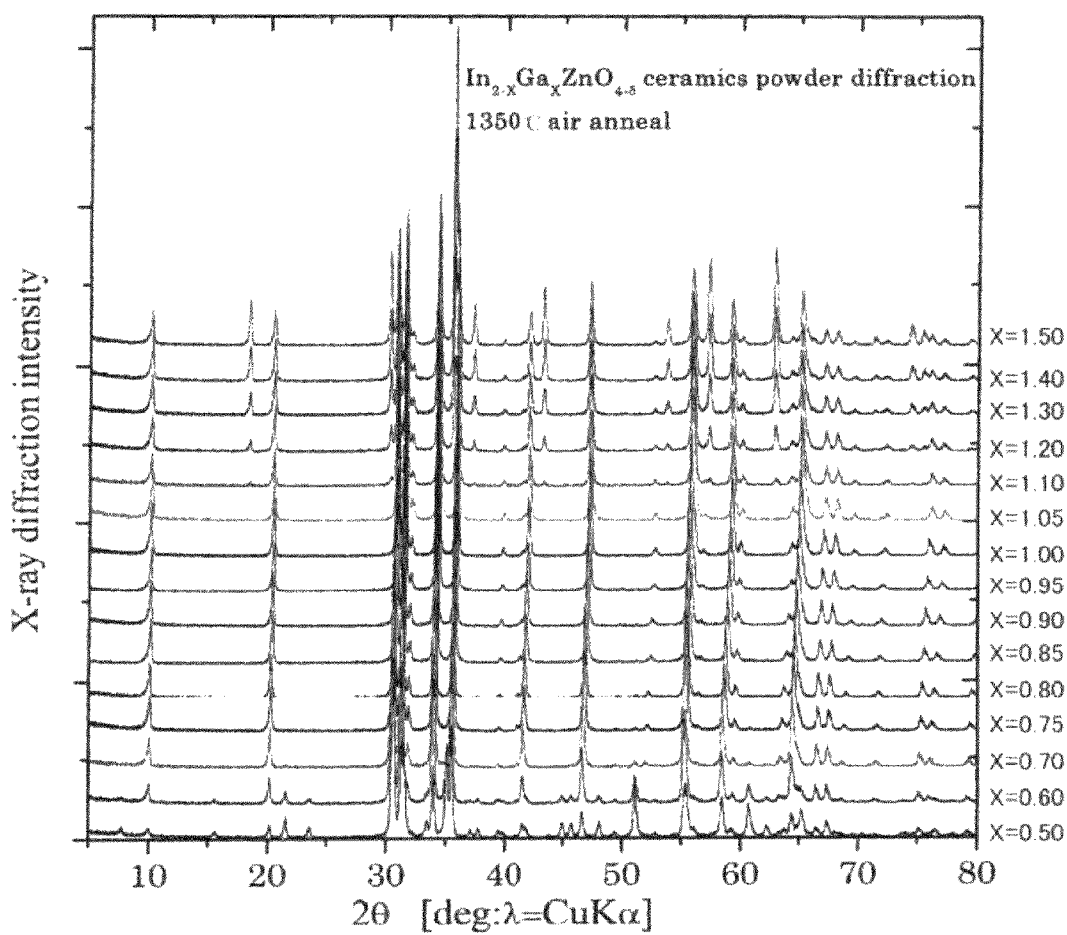
FIG. 5 shows the X-ray diffraction patterns of samples 1 to 15 after the main-annealing.

FIG. 5 shows the X-ray diffraction patterns of samples 1 to 15 after performing the main-annealing.

From the results shown in FIG. 5, it was confirmed that a single phase of $InGaZnO_4$ (JCPDS#38-1104) existed in samples 5 to 10 ($0.80 \leq x \leq 1.05$). In samples 3 and 4 ($0.70 \leq x \leq 0.75$), an $In_2O_3$ phase (JCPDS#06-0416) was precipitated in addition to an $InGaZnO_4$ phase (JCPDS#38-1104). In samples 1 and 2 ($0.50 \leq x \leq 0.60$), an $InGaZn_2O_5$ phase (JCPDS#40-0252) was further precipitated.

Moreover, in samples 11 to 15 ($1.10 \leq x \leq 1.50$), it was confirmed that a $ZnGa_2O_4$ phase (JCPDS#38-0416) was precipitated in addition to an $InGaZnO_4$ phase (JCPDS#38-1104). The above results are shown in Table 3.

TABLE 3

| Input Molar Ratio x of Ga | Precipitated Crystal Phase | JCPDS-No |
|---|---|---|
| $0.50 \leq x \leq 0.60$ | $InGaZnO_4$ | 38-1104 |
| | $In_2O_3$ | 06-0416 |
| | $InGaZn_2O_5$ | 40-0252 |
| $0.70 \leq x \leq 0.75$ | $InGaZnO_4$ | 38-1104 |
| | $In_2O_3$ | 06-0416 |
| $0.80 \leq x \leq 1.05$ | $InGaZnO_4$ | 38-1104 |
| $1.10 \leq x \leq 1.50$ | $InGaZnO_4$ | 38-1104 |
| | $ZnGa_2O_4$ | 38-0416 |

From the results described in Table 3, it is proved that the solid-solution range of Ga in $In_{2-x}Ga_xZnO_{4-\delta}$ is $0.80 \leq x \leq 1.05$. Further, although not shown in Table 3, there is a possibility that a single phase of $InGaZnO_4$ is obtained also in the ranges of $0.75 \leq x \leq 0.80$ and $1.05 \leq x \leq 1.10$. Accordingly, the solid-solution range of Ga is $0.75 \leq x \leq 1.10$, preferably $0.80 \leq x \leq 1.05$.

The solid-solution range shown above is narrower as compared with that of $0.66 \leq x \leq 1.06$ as described in Non-patent Document 2. This is because the oxide materials represented by $In_{2-x}Ga_xZnO_{4-\delta}$ obtained in the Examples are in thermal equilibrium at room temperature, as a result of decreasing the temperature in the main-annealing in a manner of "slowly cooling". Since the temperature decrease in the main-annealing is carried out in a manner of "quenching" in the method of Non-patent Document 2, the solid-solution range described therein is that under the high-temperature conditions. Since the solid-solution range is considered to be generally broader at a higher temperature, the solid-solution range described in Non-patent Document 2 is broader than that shown in the results of the Examples of the invention.

6. Calculation of Lattice Constant

In order to calculate the lattice constant of samples 1 to 15, the values are plotted according to the values of the Nelson-Riley function $\frac{1}{2}\{(\cos\theta)^2/\sin\theta + (\cos\theta)^2/\theta\}$ calculated from the angle 2θ at each diffraction peak in the X-diffraction pattern as the x axis and the values of the lattice constant at each index obtained from Bragg's diffraction condition as the y axis. Subsequently, the value of the y-intercept of the line obtained by a leastsquares method was calculated as the true lattice constant.

More specifically, since $InGaZnO_4$ is a hexagonal crystal, the value of c-axis lattice constant was calculated prior to the calculation of the value of a-axis lattice constant. The true c-axis lattice constant was calculated using a Nelson-Riley function from the values of lattice constant obtained from the diffraction lines at (0012), (0015) and (0018).

The true a-axis lattice constant was calculated using a Nelson-Riley function from the values of lattice constant which were calculated by using the obtained true c-axis lattice constant at 2θ=80° to 135°.

Figure 6:
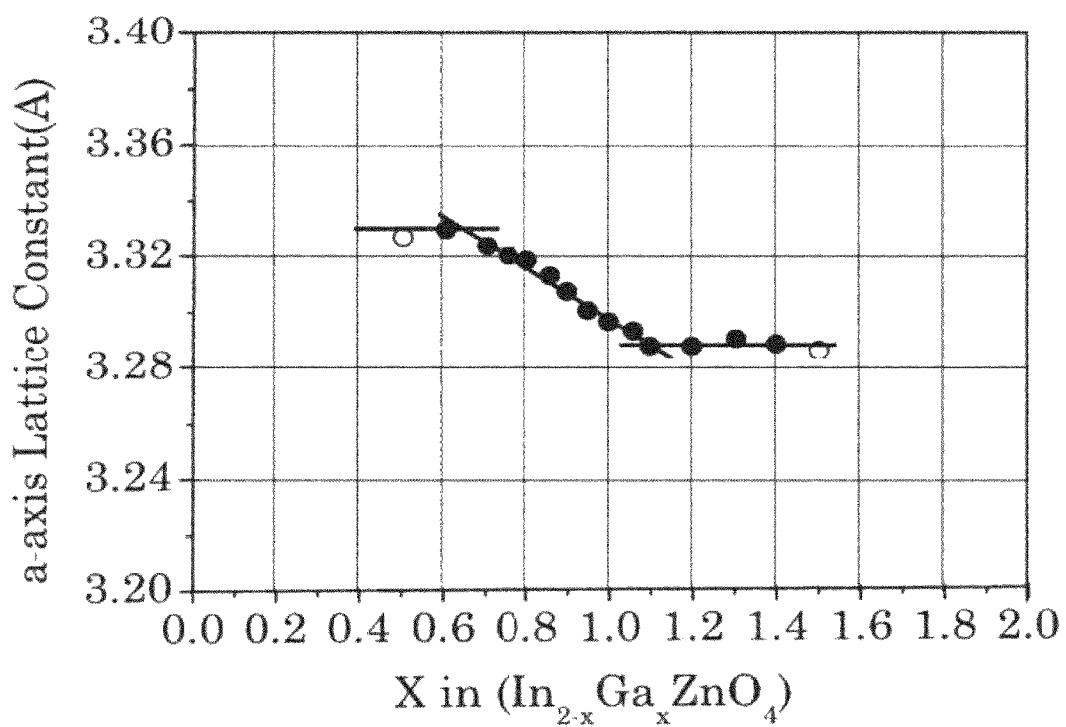
FIG. 6 shows the calculation results of a-axis lattice constant of samples 1 to 15.
Figure 7:
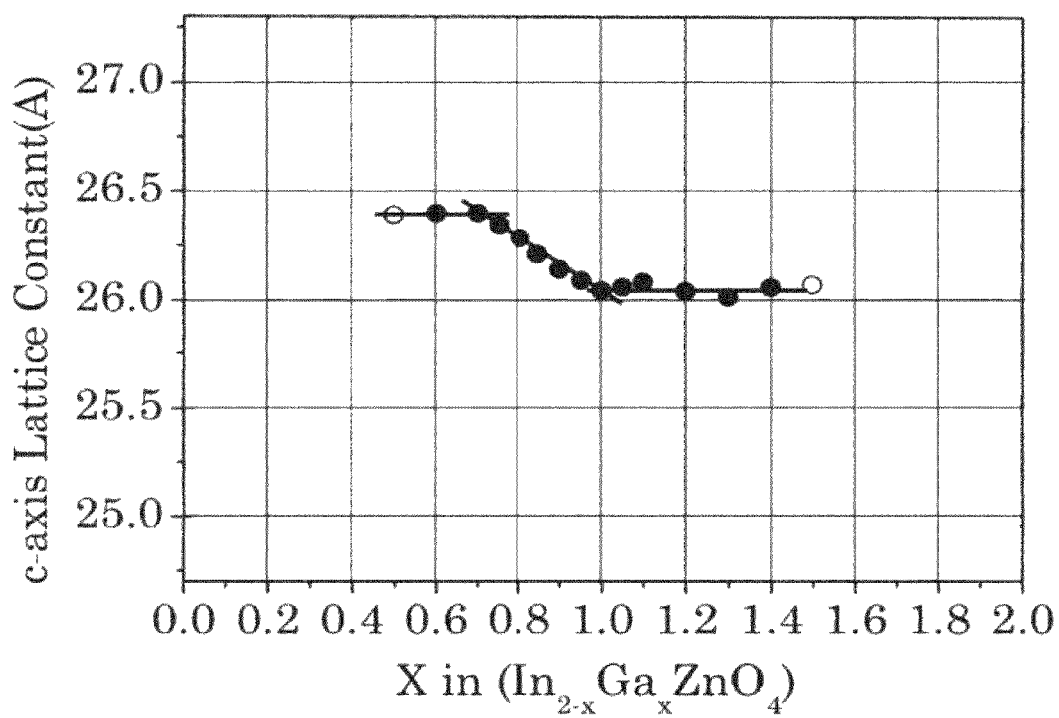
FIG. 7 shows the calculation results of c-axis lattice constant of samples 1 to 15.

FIG. 6 shows the calculation results of a-axis lattice constant of samples 1 to 15, and FIG. 7 shows the calculation results of c-axis lattice constant of samples 1 to 15.

As shown in FIG. 6 and FIG. 7, it was confirmed that the calculation results of sample 9 (x=1) were a=0.3298 nm and c=2.6028 nm, which were relatively closer to the values shown by a JCPDS card of $InGaZnO_4$ (No. 38-1104) of a=0.3295 nm and c=2.607 nm.

Further, it was proved that as the input molar ratio x of Ga was increased, the a-axis lattice constant and the c-axis lattice constant were both decreased. This result is considered to be a behavior within a predictable range according to Vegard's law that is derived from the fact that the ion radius of Ga is smaller than that of In.

7. Evaluation of Electrical Characteristics

An Au electrode was formed at a Van der Pauw position using the pellets having the size of 6 mm³ of samples 1 to 15 after being subjected to main-annealing. Thereafter, the values of resistivity of samples 1 to 15 were measured using an AC Hall measurement device (RESITEST 8300, trade name, manufactured by Toyo Corporation), and the values of carrier concentration and mobility were calculated by carrying out a Hall measurement. These measurements were conducted under a nitrogen gas atmosphere.

Figure 8:
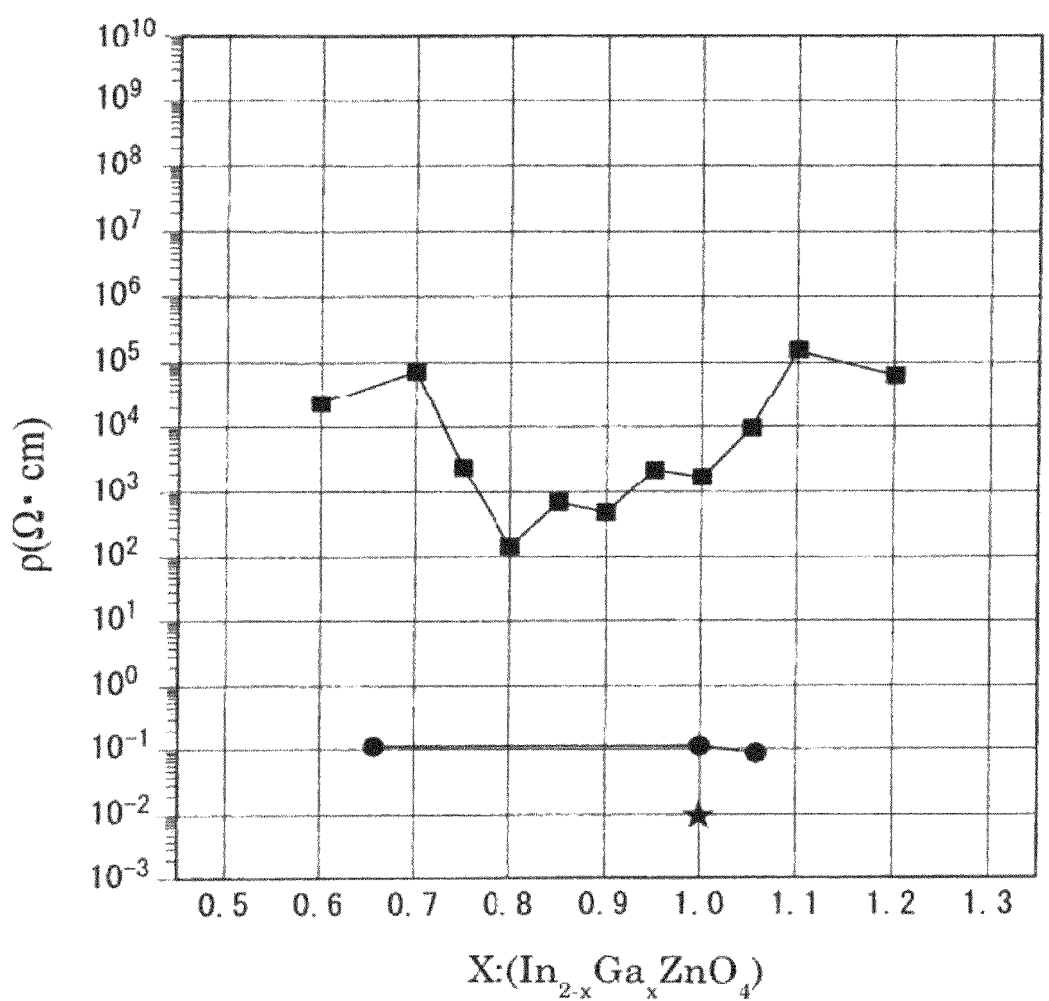
FIG. 8 shows the measurement results of value of resistivity of samples 1 to 15.

FIG. 8 shows the measurement results of the value of resistivity of samples 1 to 15 (square symbols in the graph). For the purpose of comparison, the values of resistivity described in Non-patent Document 2 (circle symbols in the graph) and the values of resistivity described in Japanese Journal of Applied Physics, 34 (1995) pp. L1550 to L1552 (star symbols in the graph) are also described.

From the measurement results shown in FIG. 8, it was confirmed that the value of resistivity was lower in the single-phase region in which the input molar ratio x of Ga is $0.80 \leq x \leq 1.05$, as compared with the case in which x was in other regions. It was also confirmed that the value of resistivity was increased as the value of x was increased.

Further, the values of resistivity obtained in the invention are more than three orders of magnitude higher than those described in Non-patent Document 2. This is because the production method described in Non-patent Document 2 includes a process of performing quenching from a high temperature, and the amount of oxygen vacancy δ is increased as a result of performing the quenching. In the method of Non-patent Document 2, the amount of oxygen vacancy δ is purposely increased by performing quenching with the vision of development as conductive materials. However, for example, for producing a semiconductor layer (active layer) of a TFT, the material preferably has a small amount of oxygen vacancy δ and a high degree of resistivity. Therefore, it can be said that changes in the electrical characteristics of an IGZO-based oxide material, which has a small amount of oxygen vacancy and is at thermal equilibrium at room temperature, were shown for the first time by the present examples.

Figure 9:
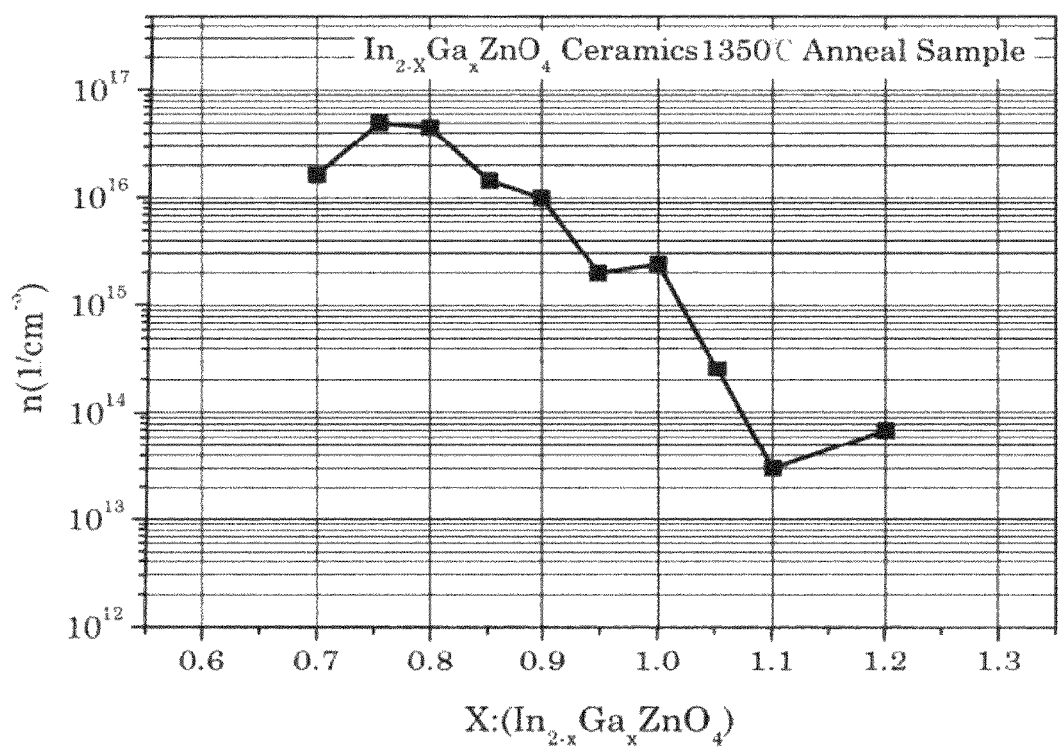
FIG. 9 shows the calculation results of carrier concentration of samples 1 to 15.
Figure 10:
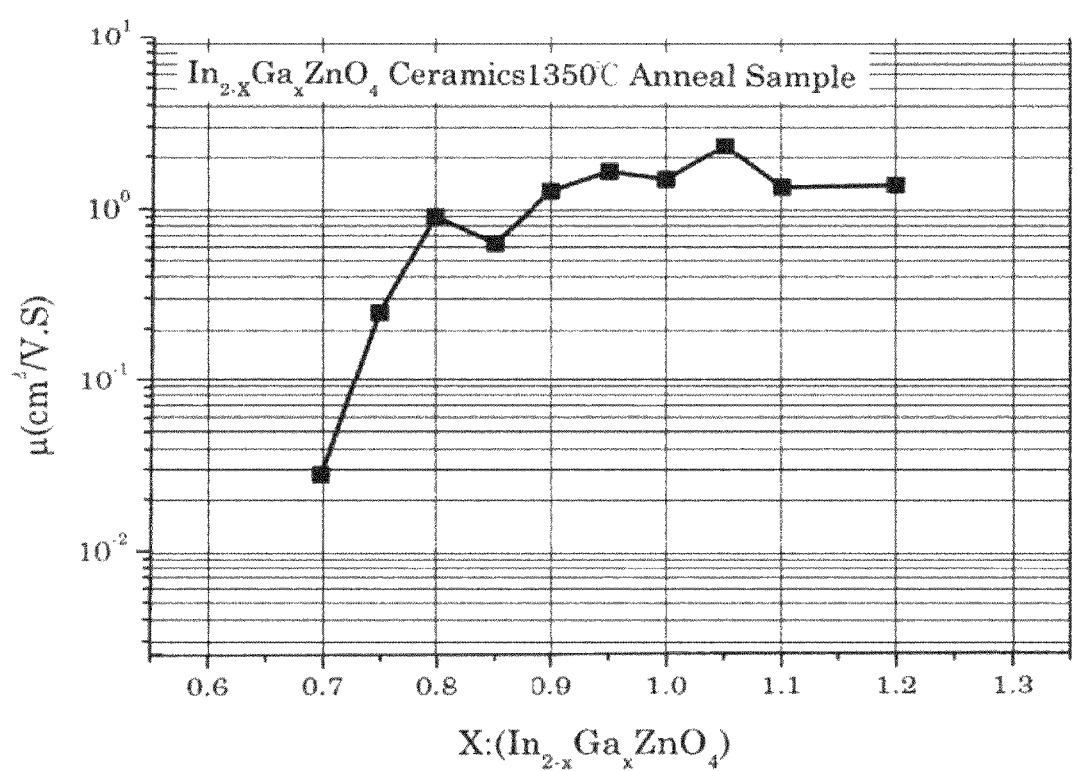
FIG. 10 shows the calculation results of mobility of samples 1 to 15.

FIG. 9 shows the calculation results of carrier concentration of samples 1 to 15, and FIG. 10 shows the calculation results of mobility of samples 1 to 15.

From the calculation results shown in FIG. 9 and FIG. 10, it was proved that when the input molar ratio x of Ga was increased in the single-phase region, the carrier concentration was decreased by three orders of magnitude, whereas the mobility did not significantly change. As a result, it was proved that the change in carrier concentration was a predominant factor of the change in the value of resistivity in the single-phase region.

Moreover, as shown in FIG. 9, the carrier concentrations of samples 1 to 15 were not higher than $10^{18}$ cm$^{-3}$, i.e., within a region of carrier concentration shown by a common type of semiconductor. The carrier concentration of the IGZO-based oxide material according to the invention is preferably in the range of more than $10^{13}$ cm$^{-3}$ to less than $10^{17}$ cm$^{-3}$.

8. Evaluation of an Amount of Oxygen Vacancy

The amount of oxygen vacancy δmax of $In_{2-x}Ga_xZnO_{4-\delta}$ at which the value of resistivity was $\rho \geq 10^2$ Ω·cm, which was suitable for an active layer of a TFT, was calculated. Specifically, the value of δmax was calculated based on a combination of the results of the measurement of temperature dependency of the value of resistivity, Hall measurement and thermogravimetric analysis, in a manner as shown below.

(1) Measurement of Temperature Dependency of Value of Resistivity

Figure 11:
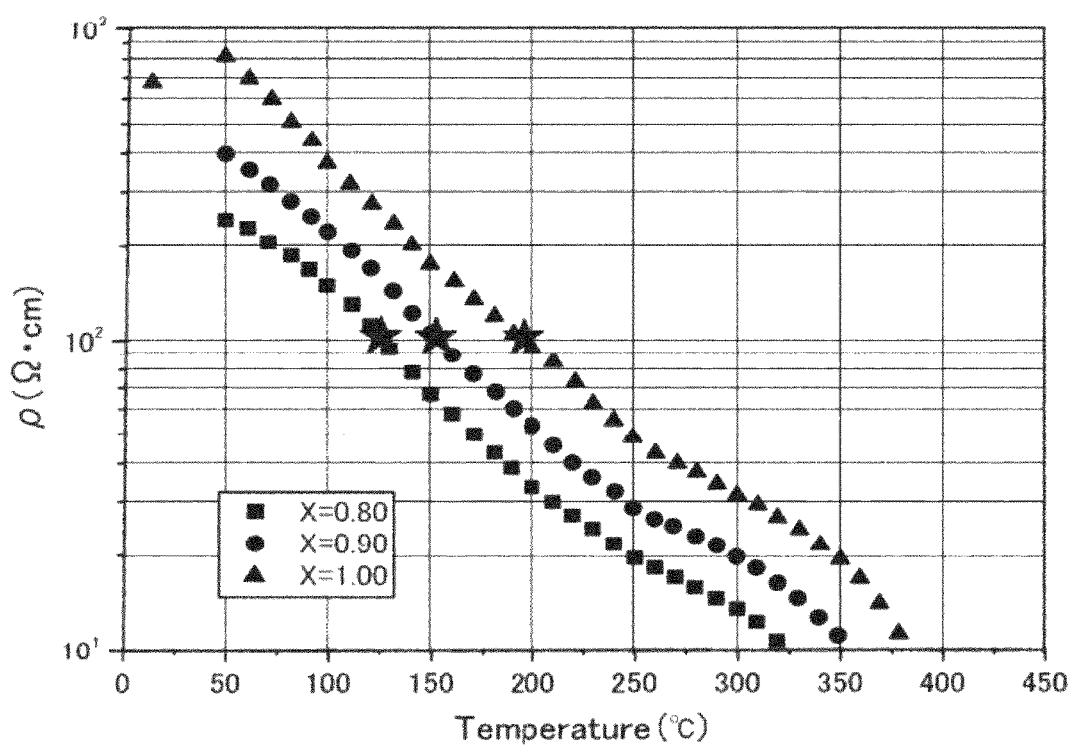
FIG. 11 shows the measurement results of temperature dependency of resistivity of samples 5, 7 and 9.

The temperature dependency of the value of resistivity of sample 5 (x=0.80), sample 7 (x=0.90) and sample 9 (x=1.00) as shown in Table 2 were measured in an argon atmosphere. FIG. 11 shows the measurement results of temperature dependency of the value of resistivity of samples 5, 7 and 9. Temperature $T_\rho$ at which the value of resistivity p is in the range of $\rho \geq 10^2$ Ω·cm, which is suitable for an active layer of a TFT, was calculated from these measurement results (see the star symbols in the graph). As a result, the $T_\rho$ at x=0.80 was 125.5° C., the $T_\rho$ at x=0.90 was 153.4° C. and the $T_\rho$ at x=1.00 was 194.0° C.

(2) Hall Measurement

Figure 12:
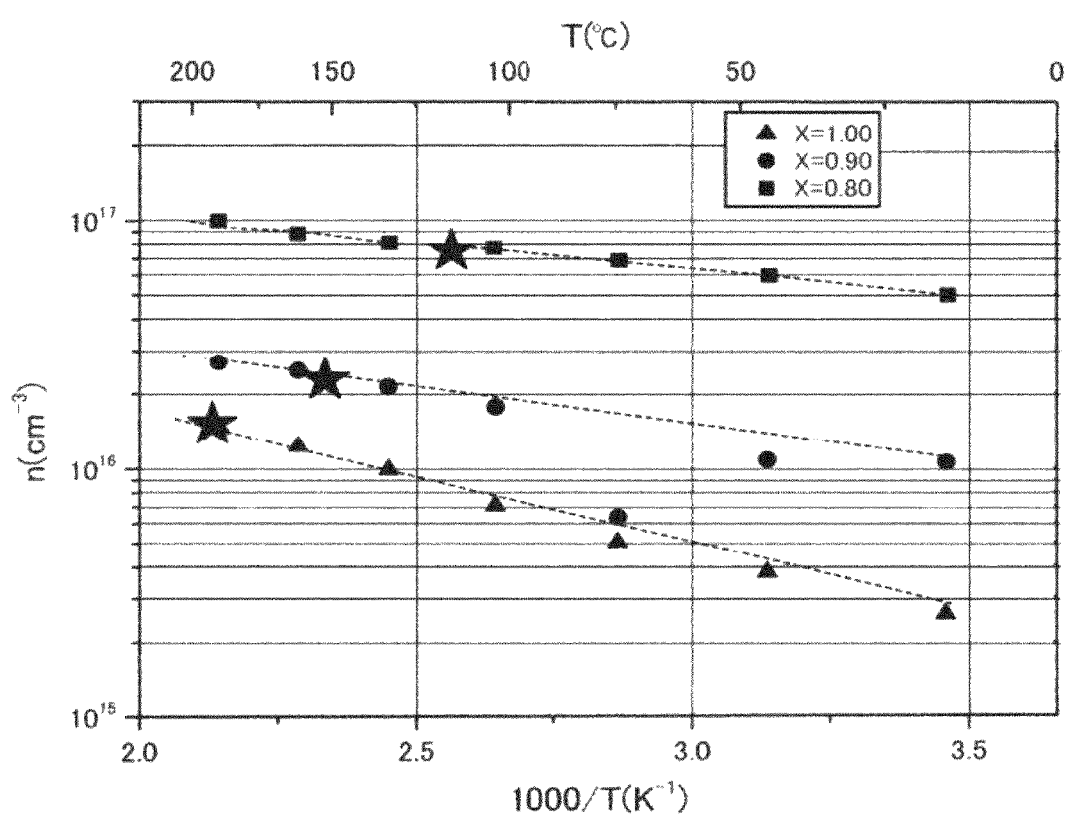
FIG. 12 shows the results of Hall measurement of samples 5, 7 and 9 conducted at different temperatures.

The Hall measurement of sample 5 (x=0.80), sample 7 (x=0.90) and sample 9 (x=1.00) was conducted in an argon atmosphere while changing the temperature. FIG. 12 shows the result of Hall measurement of samples 5, 7 and 9 as measured at different temperatures. From these measurement results, the value of carrier concentration $n_{T\rho}$ was calculated (see the star symbols in the graph). As a result, the $n_{T\rho}$ where x=0.80 was $8.20 \times 10^{16}$ (cm$^{-3}$), the $n_{T\rho}$ where x=0.90 was $2.09 \times 10^{16}$ (cm$^{-3}$) and the $n_{T\rho}$ where x=1.00 was $1.57 \times 10^{16}$ (cm$^{-3}$).

Subsequently, the difference Δn in the carrier concentration $n_{T\rho}$ at a temperature $T_\rho$ and the career concentration $n_{RT}$ at room temperature $T_{RT}$ (25° C.), expressed by $\Delta n = n_{T\rho} - n_{RT}$, was calculated. The value of Δn where x=0.80 was $3.28 \times 10^{16}$ (cm$^{-3}$), the value of Δn where x=0.90 was $1.28 \times 10^{16}$ (cm$^{-3}$), and the value of Δn where x=1.00 was $1.33 \times 10^{16}$ (cm$^{-3}$).

The difference Δn indicates the amount of carriers generated while changing the temperature of $In_{2-x}Ga_xZnO_{4-\delta}$ from room temperature $T_{RT}$ to $T_\rho$, which corresponds to the amount of carriers generated by the relative amount of change of oxygen vacancy Δδ as described later. In the present examples, all of the increase or decrease in carrier concentration are assumed to be due to the oxygen vacancy.

(3) Thermogravimetric Analysis

The thermogravimetric analysis of sample 5 (x=0.80), sample 7 (x=0.90) and sample 9 (x=1.00) was conducted using a measurement device (PYRIS 1 TGA, trade name, manufactured by PerkinElmer Inc.) Specifically, the measurement was conducted under an argon atmosphere at a flow rate of 40 cc/mm, by increasing the temperature up to 400° C. at a rate of 15° C./min.

Figure 13:
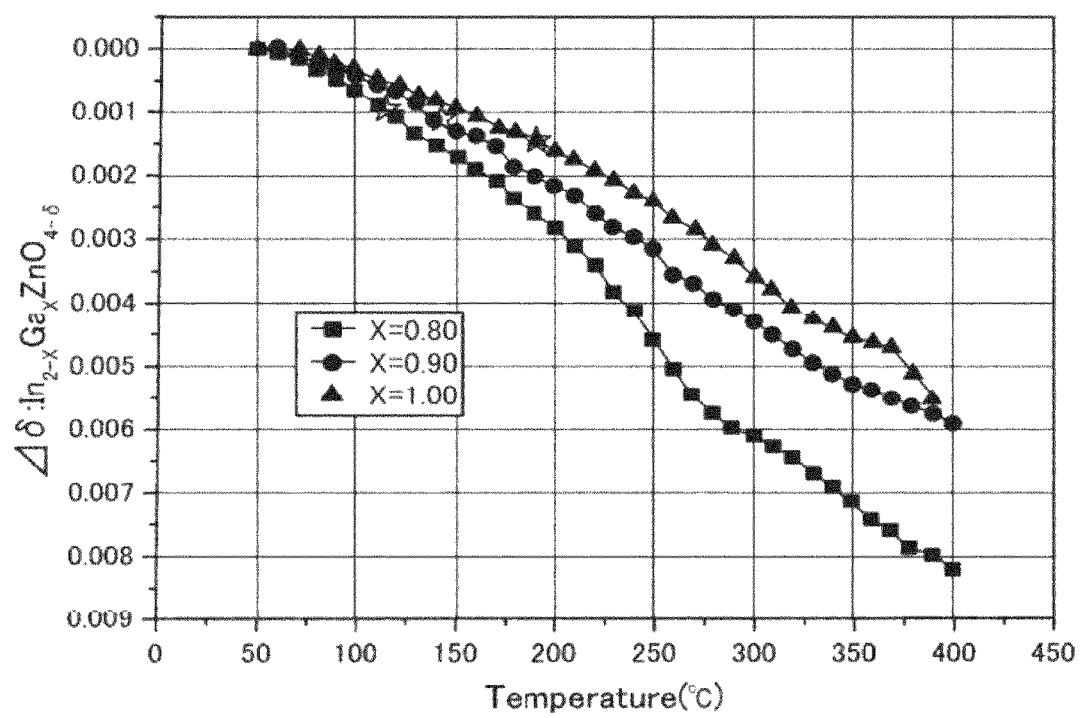
FIG. 13 shows the results of thermogravimetric measurement of samples 5, 7 and 9.

FIG. 13 shows the measurement results of thermogravimetric analysis of samples 5, 7 and 9. The value Δδ along the longitudinal axis indicates the relative amount of change of oxygen vacancy per mole of IGZO, which is converted from the weight to the amount of oxygen vacancy based on the assumption that all changes observed in the thermogravimetric analysis is caused by oxygen vacancy, and represents a relative amount of change between the amount of oxygen vacancy as measured at room temperature and the amount of oxygen vacancy as measured after heating the sample to a predetermined temperature.

From the measurement results obtained in the above process, the relative amount of change Δδ of each sample at $T_\rho$ was calculated (star symbols shown in the drawing). As a result, the Δδ of sample 5 (x=0.80) was 0.00121, the Δδ of sample 7 (x=0.90) was 0.00132, and the Δδ of sample 9 (x=1.00) was 0.00153.

(4) Calculation of an Amount of Oxygen Vacancy δmax

The value of an amount of oxygen vacancy δmax can be calculated by adding the amount of oxygen vacancy $\delta_{RT}$ of samples 5, 7 and 9 that already existed at room temperature $T_{RT}$ (before annealing) and the relative amount of change of oxygen vacancy Δδ after annealing the samples to a temperature of $T_\rho$ (refer to the following expression (1)).

$$\delta max = \delta_{RT} + \Delta\delta \quad (1)$$

Since there is a correlation between the amount of oxygen vacancy and the carrier concentration, the following expressions (2) and (3) are derived when the conversion constant for converting the carrier concentration to the amount of oxygen vacancy is given as α.

$$n_{RT} \times \alpha = \delta_{RT} \quad (2)$$

$$\Delta n \times \alpha = \Delta\delta \quad (3)$$

In order to calculate the value of $\delta_{RT}$, conversion constant α of each sample was obtained using expression (3). Then, the obtained α was substituted into expression (2) together with $n_{RT}$, thereby calculating $\delta_{RT}$.

As a result of the above calculation, the $\delta_{RT}$ of sample 5 (x=0.80) was 0.00179, the $\delta_{RT}$ of sample 7 (x=0.90) was 0.00084, and the $\delta_{RT}$ of sample 9 (x=1.00) was 0.00027. As shown in FIG. 8, the values of resistivity ρ of the IGZOs having an amount of oxygen vacancy of $\delta_{RT}$ were $10^2$ Ω·cm or higher. Therefore, these amounts of oxygen vacancy $\delta_{RT}$ can be considered to be suitable for an active layer of a TFT.

Finally, the obtained Δδ and the calculated $\delta_{RT}$ were substituted into expression (1), thereby calculating δmax.

As a result of the above calculation, the δmax of sample 5 (x=0.80) was 0.00300, the δmax of sample 7 (x=0.90) was 0.00216, and the δmax of sample 9 (x=1.00) was 0.00180.

Figure 14:
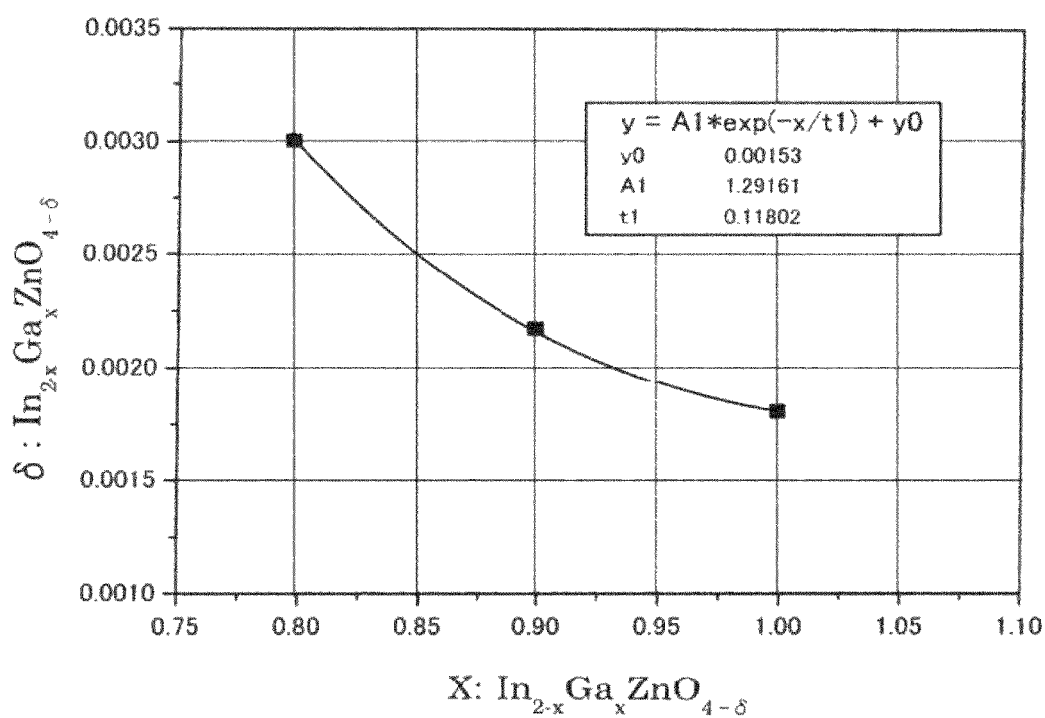
FIG. 14 shows the correlative relationship of input molar ratio x of Ga and δmax of IGZO.

FIG. 14 shows the correlative relationship of input molar ratio x of Ga and δmax of IGZO.

The relational expression of molar ratio x and δmax was obtained from three data points shown in FIG. 14. Specifically, fitting of these three data points was conducted using a relational expression: y=A1×exp(−x/t1)+Y0, and constants A1, t1 and Y0 were obtained.

As a result, the following relational expression (4) was obtained.

$$\delta max = 1.29161 \times \exp(-x/0.11802) + 0.00153 \quad (4)$$

From the above results, it was derived that in the single-phase region of $In_{2-x}Ga_xZnO_{4-\delta}$, the range of δ≦ δmax=1.29161×exp(−x/0.11802)+0.00153 was δ in which the value of resistivity ρ was $10^2$ Ω·cm or higher, considering the fact that the carrier concentration can be more suppressed when the amount of oxygen vacancy is smaller.

Example 2

In Example 2, a sample in which the input molar ratio x of Ga was 1.00 and a sample in which the input molar ratio x of Ga was 0.80 were produced in accordance with the method and conditions similar to that of Example 1. However, the average rate of temperature decrease during the main-annealing was 500° C./h in Example 2, instead of 100° C./h in Example 1.

Subsequently, X-ray diffraction measurement, calculation of lattice constant and evaluation of electrical characteristics of these two samples (x=1.00, 0.80) were conducted in accordance with the method and conditions similar to that of Example 1.

As a result of the X-ray diffraction measurement, it was confirmed that a single phase of $InGaZnO_4$ (JCPDS#38-1104) was obtained both in these two samples (x=1.00, 0.80).

As a result of the calculation of lattice constant, the lattice constants of the sample (x=1.00) were a=0.3294 nm and c=2.6036 nm, which were relatively closer to the lattice constants of a=0.3295 nm and c=2.6070 nm indicated by a JCPDS card of $InGaZnO_4$ (No. 38-1104). Further, the lattice constants of the sample (x=0.80) were a=0.3320 nm and c=2.6272 nm. From these results, it was proved that as the input molar ratio x of Ga having a small ionic radius was increased, the lattice constants on the a-axis and the c-axis were also decreased, as was the case with Example 1.

As a result of measuring the value of resistivity of each sample, the value of resistivity ρ of the sample (x=1.00) was 9.83×$10^2$ Ω·cm, and the value of resistivity ρ of the sample (x=0.80) was 1.12×$10^2$ Ω·cm. From these results, it was proved that as the input molar ratio x of Ga was increased, the value of resistivity was also increased, as was the case with Example 1.

Then, Hall measurement of each sample was conducted to calculate the mobility and carrier concentration thereof. As a result, the mobility (μ) and the carrier concentration (n) of the sample (x=1.00) were μ=0.83 $cm^2$/V.S and n=3.50×$10^{15}$ $cm^{-3}$, respectively; and the mobility (μ) and the carrier concentration (n) of the sample (x=0.80) were μ=0.74 $cm^2$/V.S and n=6.21×$10^{16}$ $cm^{-3}$, respectively. In view of the above, it was proved that the carrier concentration was the dominant factor for causing changes in the value of resistivity, as was the case with Example 1.

Example 3

In Example 3, a sample in which the input molar ratio x of Ga was 1.00 and a sample in which the input molar ratio x of Ga was 0.80 were produced in accordance with the method and conditions similar to that of Example 1. However, the average rate of temperature decrease during the main-annealing was 50° C./h in Example 3, instead of 100° C./h in Example 1.

Subsequently, X-ray diffraction measurement, calculation of lattice constant and evaluation of electrical characteristics of these two samples (x=1.00, 0.80) were conducted in accordance with the method and conditions similar to that of Example 1.

As a result of the X-ray diffraction measurement, it was confirmed that a single phase of $InGaZnO_4$ (JCPDS#38-1104) was obtained in these two samples (x=1.00, 0.80).

As a result of the calculation of lattice constant, the lattice constants of the sample (x=1.00) were a=0.3295 nm and c=2.6038 nm, which were relatively closer to the lattice constants of a=0.3295 nm and c=2.6070 nm indicated by a JCPDS card of $InGaZnO_4$ (No. 38-1104). Further, the lattice constants of the sample (x=0.80) were a=0.3321 nm and c=2.6275 nm. From these results, it was proved that as the input molar ratio x of Ga having a small ionic radius was increased, the lattice constants on the a-axis and the c-axis were also decreased, as was the case with Example 1 and Example 2.

As a result of measuring the value of resistivity of each sample, the value of resistivity ρ of the sample (x=1.00) was 5.21×$10^3$ Ω·cm, and the value of resistivity ρ of the sample (x=0.80) was 3.54×$10^2$ Ω·cm. From these results, it was proved that as the input molar ratio x of Ga was increased, the value of resistivity was also increased, as was the case with Example 1.

Then, Hall measurement of each sample was conducted to calculate the mobility and carrier concentration thereof. As a result, the mobility (μ) and the carrier concentration (n) of the sample (x=1.00) were μ=0.67 $cm^2$/V.S and n=9.81×$10^{14}$ $cm^{-3}$, respectively; and the mobility (μ) and the carrier concentration (n) of the sample (x=0.80) were μ=0.78 $cm^2$/V.S and n=5.23×$10^{16}$ $cm^{-3}$, respectively. In view of the above, it was proved that the carrier concentration was the dominant factor for causing changes in the value of resistivity, as was the case with Example 1 and Example 2.

Example 4

In Example 4, a sample in which the input molar ratio x of Ga was 1.00 was prepared by a method and conditions similar to that of Example 1. However, Example 4 employed furnace cooling, which was capable of rapid cooling by turning off the power of an electric furnace to allow natural cooling from the maximum annealing temperature (Tmax=1350° C.), instead of "slowly cooling" employed in Example 1 for temperature decrease during the main-annealing.

Further, the sample was subjected to post-annealing by increasing the temperature up to 500° C. in an atmosphere of oxygen gas 100% at a rate of temperature increase of 500°

C./h, maintaining this temperature for 2 hours, and then cooling the same at an average rate of temperature decrease of 100° C./h.

X-ray measurement, calculation of lattice constant and evaluation of electrical characteristics of the sample was conducted by the same method and conditions to that of Example 1, both before and after the post-annealing.

As a result of the X-ray diffraction measurement, it was confirmed that a single phase of $InGaZnO_4$ (JCPDS#38-1104) was obtained in the sample in both cases of before and after the post-annealing.

The calculation result of the lattice constant was that the lattice constants of the sample before the post-annealing were a=0.3291 nm and c=2.6040 nm, and the lattice constants of the sample after the post-annealing were a=0.3291 nm and c=2.6040 nm.

As a result, it was proved that the lattice constants of the sample in both cases of before and after the post-annealing were relatively similar to a=0.3321 nm and c=2.6275 nm shown by a JCPDS card of $InGaZnO_4$ (No. 38-1104).

The result of measuring the value of resistivity of the sample before the post-annealing was $\rho=3.21\times10^3$ Ω·cm before the post-annealing, whereas the value of resistivity of each sample after the post-annealing was $\rho=5.31\times10^3$ Ω·cm after the post-annealing. Therefore, it was confirmed that the value of resistivity was increased by performing post-annealing. As a result, it was confirmed that the value of resistivity of an IGZO oxide material could be increased up to a value at which the material could operate as an active layer of a TFT, or the like, by performing post-annealing in an oxidizing atmosphere that contains oxygen.

The invention includes the following exemplary embodiments.

<1> An IGZO-based oxide material represented by a composition formula of $In_{2-x}Ga_xZnO_{4-\delta}$, where 0.75<x<1.10 and $0<\delta\leq1.29161\times\exp(-x/0.11802)+0.00153$, and formed from a single phase of IGZO having a crystal structure of $YbFe_2O_4$.

<2> The IGZO-based oxide material according to <1>, wherein the IGZO-based oxide material has a value of resistivity of from $1\times10^2$ Ω·cm to $1\times10^9$ Ω·cm.

<3> The IGZO-based oxide material according to <1>, wherein the IGZO-based oxide material is a semiconductor.

<4> The IGZO-based oxide material according to <1> or <2>, wherein x in a composition formula satisfies $0.80\leq x\leq1.05$.

<5> The IGZO-based oxide material according to <4>, wherein x in a composition formula satisfies $0.80\leq x\leq1.00$.

<6> The IGZO-based oxide material according to any of <1> to <5>, wherein the IGZO-based oxide material has a carrier concentration of from more than $10^{13}$ cm$^{-3}$ to less than $10^{17}$ cm$^{-3}$.

<7> A method of producing the IGZO-based oxide material according to any of <1> to <6>, the method comprising annealing, in an oxygen-containing atmosphere, a mixed material including In, Ga and Zn, under the conditions of the maximum annealing temperature of from 1200° C. to 1400° C. and the average rate of temperature decrease of from 50° C./hr to 500° C./hr from the maximum annealing temperature to 300° C.

<8> The method of producing the IGZO-based oxide material according to <7>, wherein the average rate of temperature decrease is from 100° C./hr to 200° C./hr.

<9> The method of producing the IGZO-based oxide material according to <7> or <8>, wherein the maximum annealing temperature is from 1350° C. to 1400° C.

<10> A method of producing the IGZO-based oxide material according to any of <1> to <6>, the method comprising:
producing an IGZO-based oxide represented by a composition formula of $In_{2-x}Ga_xZnO_{4-\delta}$, where 0.75<x<1.10 and δ>0, and formed from a single phase of IGZO having a crystal structure of $YbFe_2O_4$; and
controlling the range of δ in the composition formula of the IGZO-based oxide to $0<\delta\leq1.29161\times\exp(-x/0.11802)+0.00153$ by subjecting the IGZO-based oxide to post-annealing in an oxidizing atmosphere that contains oxygen.

All publications, patent applications, and technical standards mentioned in this specification are herein incorporated by reference to the same extent as if each individual publication, patent application, or technical standard was specifically and individually indicated to be incorporated by reference.

What is claimed is:

1. An IGZO-based oxide material represented by a composition formula of $In_{2-x}Ga_xZnO_{4-\delta}$, where 0.75<x<1.10 and $0<\delta\leq1.29161\times\exp(-x/0.11802)+0.00153$, and formed from a single phase of IGZO having a crystal structure of $YbFe_2O_4$, wherein the IGZO-based oxide material has a value of resistivity of from $1\times10^2$ Ω·cm to $1\times10^9$ Ω·cm.

2. The IGZO-based oxide material according to claim 1, wherein the IGZO-based oxide material is a semiconductor.

3. The IGZO-based oxide material according to claim 1, wherein x in the composition formula satisfies $0.80\leq x\leq1.05$.

4. The IGZO-based oxide material according to claim 3, wherein x in the composition formula satisfies $0.80\leq x\leq1.00$.

5. The IGZO-based oxide material according to claim 1, wherein the IGZO-based oxide material has a carrier concentration of from more than $10^{13}$ cm$^{-3}$ to less than $10^{17}$ cm$^{-3}$.

6. A method of producing the IGZO-based oxide material according to claim 1, the method comprising annealing, in an oxygen-containing atmosphere, a mixed material including In, Ga and Zn, under conditions of a maximum annealing temperature of from 1200° C. to 1400° C. and an average rate of temperature decrease from the maximum annealing temperature to 300° C. of from 50° C./hr to 500° C./hr.

7. The method of producing the IGZO-based oxide material according to claim 5, wherein the average rate of temperature decrease is from 100° C./hr to 200° C./hr.

8. The method of producing the IGZO-based oxide material according to claim 5, wherein the maximum annealing temperature is from 1350° C. to 1400° C.

9. A method of producing the IGZO-based oxide material according to claim 1, the method comprising:
producing an IGZO-based oxide represented by a composition formula of $In_{2-x}Ga_xZnO_{4-\delta}$, where 0.75<x<1.10 and δ>0, and formed from a single phase of IGZO having a crystal structure of $YbFe_2O_4$; and
controlling the range of δ in the composition formula of the IGZO-based oxide to $0<\delta\leq1.29161\times\exp(-x/0.11802)+0.00153$ by subjecting the IGZO-based oxide to post-annealing in an oxidizing atmosphere that contains oxygen.

* * * * *